United States Patent [19]
Wada et al.

[11] Patent Number: 5,126,751
[45] Date of Patent: Jun. 30, 1992

[54] FLUSH MOUNT ANTENNA

[75] Inventors: Steven T. Wada; Michael J. Maybell; Robert Jobsky, all of Santa Barbara, Calif.

[73] Assignee: Raytheon Company, Lexington, Mass.

[21] Appl. No.: 728,775

[22] Filed: Jul. 8, 1991

Related U.S. Application Data

[63] Continuation of Ser. No. 618,017, Nov. 26, 1990, abandoned, which is a continuation of Ser. No. 364,404, Jun. 9, 1989, abandoned.

[51] Int. Cl.$^5$ ............... H01Q 13/080; H01Q 1/400; H01Q 15/230
[52] U.S. Cl. ................... 343/789; 343/772; 343/786
[58] Field of Search ............ 343/753, 754, 783, 785, 343/705, 786, 700, 771, 772, 767, 708, 789, 873; 333/239, 248

[56] References Cited

U.S. PATENT DOCUMENTS

| | | | |
|---|---|---|---|
| 2,594,871 | 4/1952 | Chu et al. | 343/786 |
| 2,822,541 | 2/1958 | Sichak et al. | 343/776 |
| 2,822,542 | 2/1958 | Butterfield | 343/785 |
| 2,979,676 | 4/1961 | Rueger | 333/239 |
| 3,056,130 | 9/1962 | Charman | 343/767 |
| 3,534,376 | 10/1970 | Webb | 343/789 |
| 3,868,694 | 2/1975 | Meinke | 343/785 |
| 4,053,897 | 10/1977 | Nerheim | 343/785 |
| 4,087,822 | 5/1978 | Maybell et al. | 343/778 |
| 4,287,518 | 9/1981 | Ellis, Jr. | 343/708 |
| 4,313,103 | 3/1982 | Roettele et al. | 343/783 |
| 4,415,900 | 11/1983 | Kaloi | 343/700 |
| 4,443,802 | 4/1984 | Mayes | 343/729 |
| 4,460,901 | 7/1984 | Tricoles et al. | 343/785 |
| 4,527,165 | 7/1985 | de Ronde | 343/778 |
| 4,571,593 | 2/1986 | Martinson | 343/786 |
| 4,613,989 | 9/1986 | Fende et al. | 455/351 |
| 4,618,865 | 10/1986 | Lamensdorf et al. | 343/776 |
| 4,626,865 | 12/1986 | Rammos | 343/786 |
| 4,839,659 | 6/1989 | Stern et al. | 343/785 |
| 4,888,597 | 12/1989 | Rebiez et al. | 343/778 |
| 4,914,449 | 4/1990 | Fukuzawa et al. | 343/872 |

FOREIGN PATENT DOCUMENTS 2445042 12/1978 France .
1598545 11/1974 United Kingdom .

Primary Examiner—Rolf Hille
Assistant Examiner—Peter Toby Brown
Attorney, Agent, or Firm—Richard M. Sharkansky

[57] ABSTRACT

An antenna capable of being mounted flush with variously shaped surfaces. The antenna comprises a dielectric filled radiating cavity with two opposing tapered walls. The radiating cavity is excited by a microstrip horn.

4 Claims, 4 Drawing Sheets

FLUSH MOUNT ANTENNA

This application is a continuation of application Ser. No. 618,017 lfiled Nov. 26, 1990 (abandoned), which is a continuation of application Ser. No. 364,404, filed Jun. 9, 1989 (Abandoned).

BACKGROUND OF THE INVENTION

This invention relates generally to antennas and more particularly to horn antennas.

In many radio frequency systems, limited space is available for antennas. Antennas designed for small spaces, however, must meet various performance requirements. For example, the antenna must have a specified angular coverage and frequency bandwidth. Thus, existing antennas may not meet both the size and performance requirements in a system.

One common size constraint in airborne systems is that the antenna not protrude beyond the aircraft carrying the RF system. Thus, a "flush mount" antenna is required.

Various forms of flush mount antennas are known. For example, annular slot antennas, cavity inductors, strip inductors, patch antennas, surface-wave antennas and slot antennas can all be mounted flush with a surface. However, these types of antennas generally have narrow frequency bandwidths. They are thus not well suited for systems requiring frequency bandwidths of 3:1. Printed log-periodic dipoles can be cavity backed and flush mounted. These antennas can be built with 3:1 frequency bandwidths, but cannot be made small enough to meet the size constraints of some applications.

SUMMARY OF THE INVENTION

It is an object of this invention to provide an antenna that can be mounted flush with a surface.

It is also an object of this invention to provide an antenna which can conform to non-planar surfaces.

It is a further object of this invention to provide an antenna with a broad frequency bandwidth and wide angular coverage.

It is a further object of this invention to provide an antenna which fits in a relatively small volume.

It is yet a further object of this invention to provide an antenna which can be designed for end-fire or near broadside radiation patterns over a 3:1 frequency bandwidth.

The foregoing and other objects are achieved by an antenna having a radiating cavity filled with dielectric. The radiating cavity has two opposing tapered walls. Radio frequency energy is fed to the radiating cavity via a microstrip horn. The dielectric in the radiating cavity conforms with the upper surface of the antenna. The upper surface of the antenna, in turn, conforms with the surface in which the antenna is mounted.

BRIEF DESCRIPTION OF THE DRAWINGS

The invention will be better understood by reference to the following more detailed description and accompanying figures in which.

DESCRIPTION OF THE PREFERRED EMBODIMENT

Figure 1:
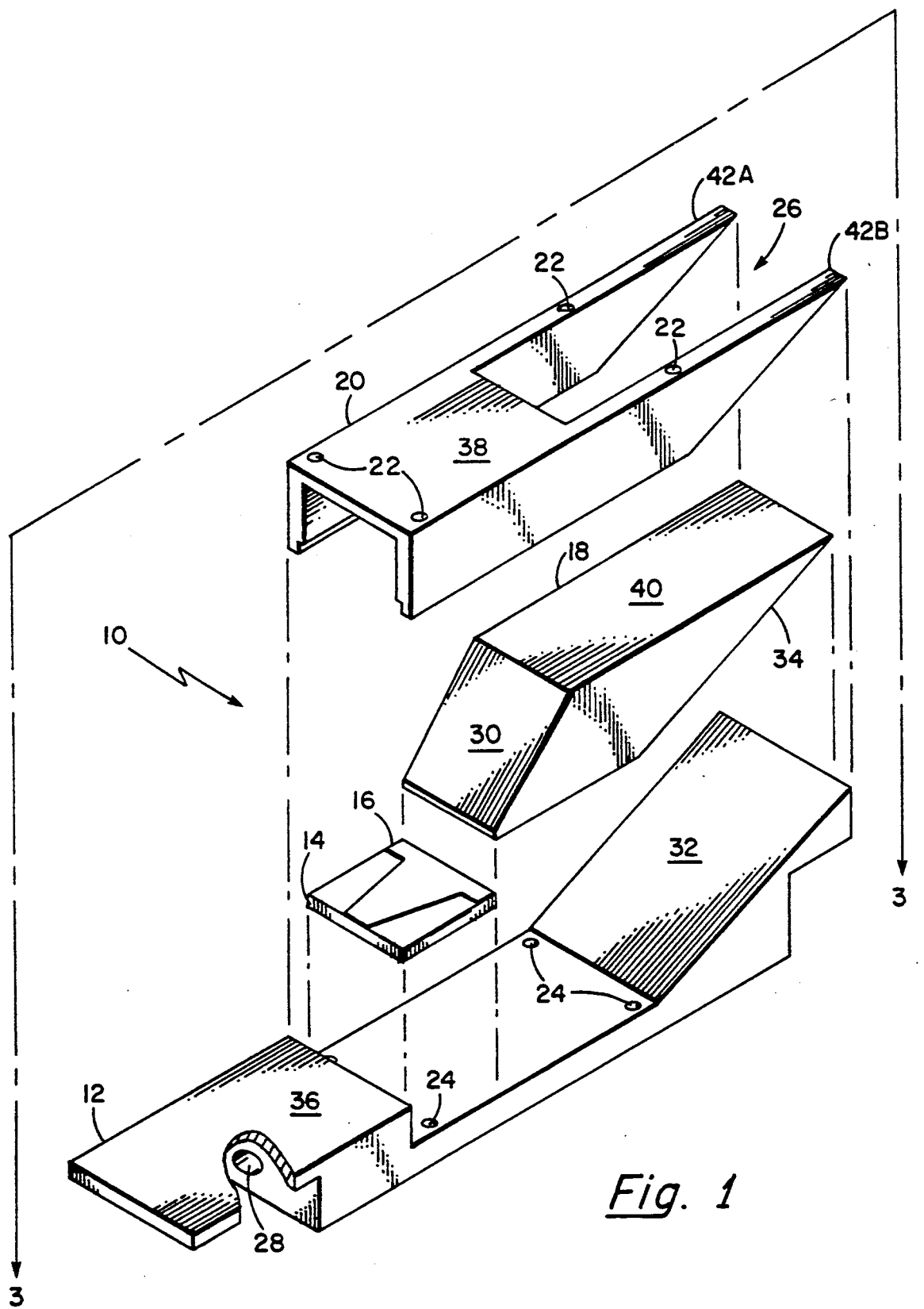
FIG. 1 shows an exploded view of an antenna constructed according to the invention.

FIG. 1 shows an exploded view of an antenna 10 constructed according to the present invention. The antenna 10 has a base 12 and a top 20 formed from a conductive metal.

A dielectric board 14 is mounted, for example by gluing or mounting screws, to the base 12. The relative dielectric constant of board 14 is $\epsilon_{rs}$. A microstrip horn 16 is patterned, in a known manner, on the upper surface (not numbered) of dielectric board 14. In operation, base 12 is at ground potential and forms the second conductor of the microstrip. A signal is applied to microstrip horn 16 through feed 28. For example, a coaxial cable (not shown) could pass through feed 28 and have its center conductor connected to microstrip horn 16.

A dielectric slab 18 with relative dielectric constant $\epsilon_r$ is also mounted, such as by gluing or captivation by top 20, to base 12. Dielectric slab 18 has a tapered surface 34 which conforms to tapered surface 32 of base 12. Dielectric slab 18 has a second tapered surface 30 which conforms to a tapered surface (element 50, FIG. 3) in top 20.

Top 20 is secured to base 12 by screws through screw holes 22 and 24 or by any other convenient means such as conductive epoxy. With top 20 secured to the base, a radiating cavity 26 is formed. The radiating cavity 26 is bounded on the bottom by base 12. Two sides of radiating cavity 26 and bounded by the inside surface of prongs 42A and 42B of top 20. A third side of radiating cavity 26 is bounded by tapered surface 50 (FIG. 3) of top 20. The fourth side of radiating cavity 26 is bounded by tapered surface 32. Dielectric slab 18 thus fills radiating cavity 26.

The base 12, top 20 and dielectric slab 18 are constructed to form a flush upper surface. In particular, with the components of antenna 10 assembled, upper surfaces 36, 38 and 40 form a surface without, discontinuities. In FIG. 1, that surface is shown to be a plane. Antenna 10 could thus be recessed into a planar surface to create a flush surface. The invention, however, is not limited to a planar flush surface.

Figure 2:
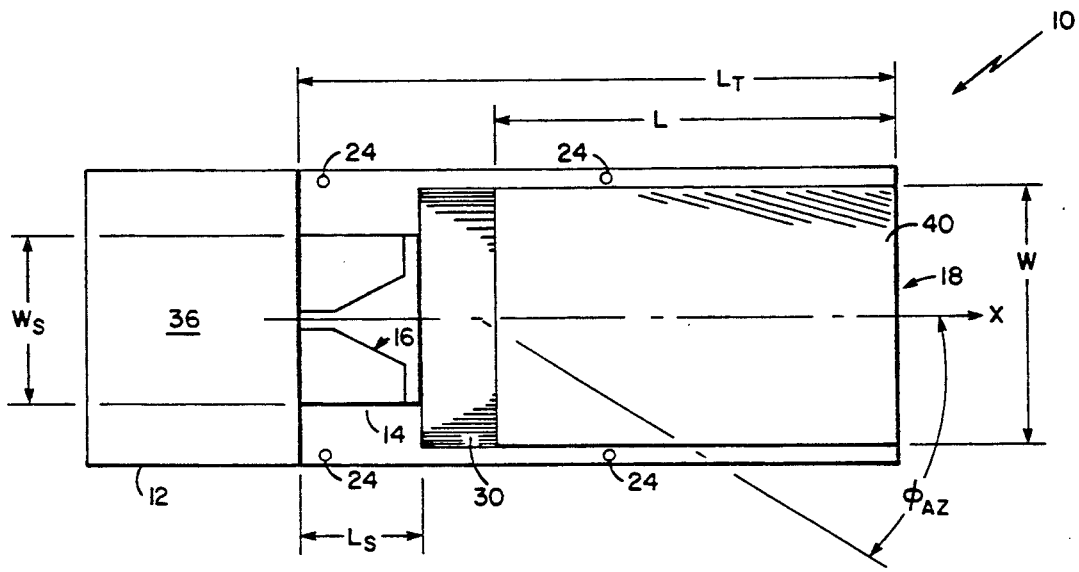
FIG. 2 is the top view of the antenna of FIG. 1 with top 20 removed.

FIG. 2 shows additional details of the antenna 10, as would be seen by looking at the top of antenna 10 (FIG. 1) with top 20 removed. In all the figures, like reference numbers denote like elements. Superimposed on the structure of FIG. 2 is an x-axis and an angle $\phi_{AZ}$ measured relative to the x-axis. The angle $\phi_{AZ}$ indicates the azimuthal direction relative to the antenna 10.

FIG. 2 also indicates various dimensions of components in antenna 10. Dielectric board 14 has a width $W_S$ and a length $L_S$. Dielectric slab 18 has a width W. Upper surface 40 has a length L. The total length of dielectric board 14 and dielectric slab 18 is $L_T$.

Figure 3:
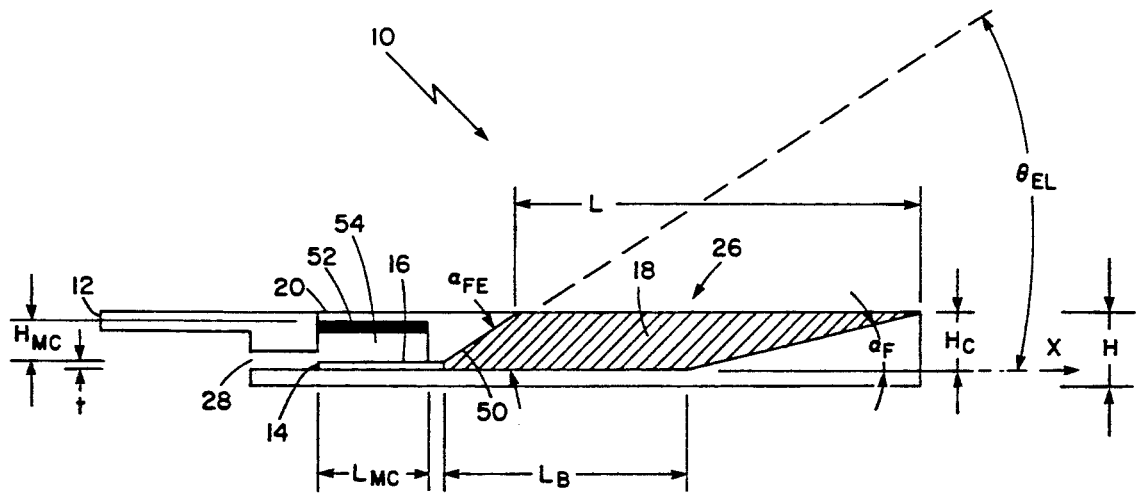
FIG. 3 is a cross-sectional view of the antenna of FIG. 1 taken along the line 3—3.

FIG. 3 shows a cross-sectional view of antenna 10 taken along the line 3—3 of FIG. 1. Details of top 20 can be seen in FIG. 3. Top 20 has a tapered surface 50 which conforms with tapered surface 30 of dielectric slab 18. Additionally, top 20 has formed in it a cavity 54 of length $L_{MC}$ and extending a height $H_{MC}$ above microstrip horn 16. Inside cavity 54, there is an absorber 52, which is any known material which absorbs radio frequency energy. Cavity 54 and absorber 52 present a load to microstrip horn 16 very similar to the load that would be present if microstrip horn 16 were in free space. In addition, absorber 52 is selected to prevent resonance in cavity 54 while absorbing a minimum of RF energy.

Top 20 is in electrical contact with dielectric horn 16. Electrically, tapered surface 50 is like an extension of microstrip horn 16. Tapered surface 50 therefore launches electrical signals travelling down microstrip horn 16 into radiating cavity 26.

Various other dimensions of antenna 10 are shown in FIG. 3. Dielectric slab 18 is shown to have a height $H_C$. The bottom of dielectric slab 18 excluding tapered surface 34 is shown to have a length $L_B$. Dielectric board 14 is shown to have a height of t. In addition, tapered surface 50 is shown to make an angle $\alpha_{FE}$ with base 12. Tapered surface 32 is shown to make an angle $\alpha_f$ with the x-axis. Also, the angle $\theta_{EL}$ is shown. Angle $\theta_{EL}$ defines the elevation direction relative to antenna 10.

In constructing an antenna according to the invention, the various dimensions of the antenna are selected based on two major considerations. First, the dimensions are selected based on the wavelength, $\lambda_o$, of the center frequency, $f_o$, of operation of the antenna. Additionally, some parameters are selected such that antenna 10 projects a beam in the desired azimuthal and elevational angles.

EXAMPLE I

Figure 4A:
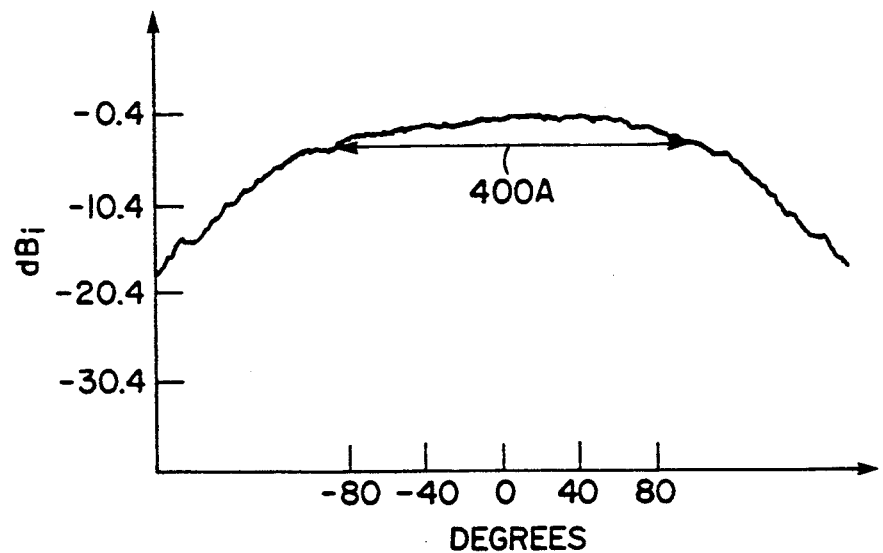
FIG. 4A is a plot showing the azimuthal beam pattern of the antenna of FIG. 1.

As an example, Table I shows dimensions selected for the various parameters of antenna 10. FIG. 4A shows the azimuthal beam pattern resulting when an antenna with the dimensions of Table I is operated at a frequency equal to $0.917f_o$. The abscissa of the plot shows azimuthal angle. The ordinate shows the gain relative to an isotropically radiating antenna measured in the far field at the azimuthal angle with the elevation angle of 0°.

Figure 4B:
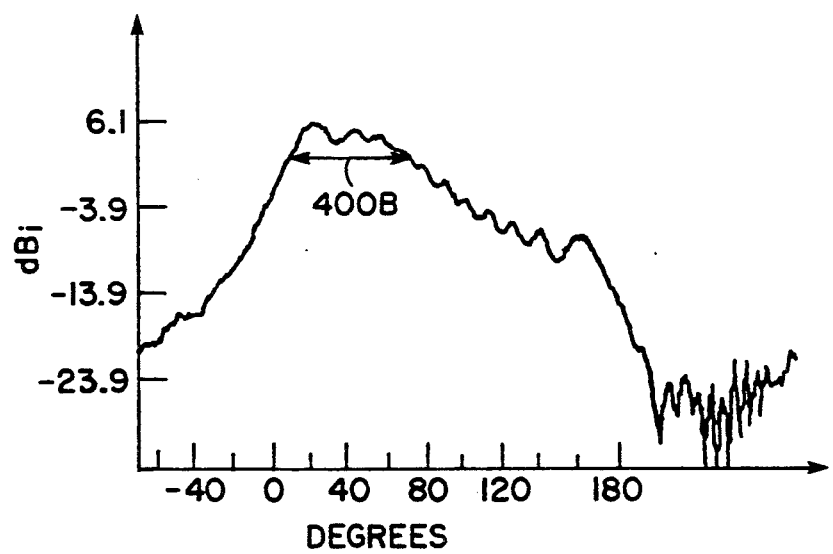
FIG. 4B is a plot showing the elevation beam pattern of the antenna of FIG. 1.

FIG. 4B shows the elevation pattern when an antenna with the dimensions of Table I is operated at a frequency of $0.917f_o$. The abscissa of the plot shows elevation angle. The ordinate shows the gain relative to an isotropically radiating antenna measured in the far field at the elevation angle with an azimuthal angle of 0°.

TABLE I

| ANTENNA PARAMETER | DIMENSIONS |
|---|---|
| L | 1.17 $\lambda_o$ |
| W | 0.51 $\lambda_o$ |
| $L_B$ | 0.61 $\lambda_o$ |
| H | 0.31 $\lambda_o$ |
| t | 0.03 $\lambda_o$ |
| $H_C$ | 0.19 $\lambda_o$ |
| $H_{MC}$ | 0.18 $\lambda_o$ |
| $W_S$ | 0.51 $\lambda_o$ |
| $L_S$ | 0.39 $\lambda_o$ |
| $L_{MC}$ | 0.36 $\lambda_o$ |
| $L_T$ | 1.78 $\lambda_o$ |
| $\alpha_{FE}$ | 40.4° |
| $\alpha_F$ | 14.9° |
| $\epsilon_r$ | 3.0 |
| $\epsilon_{rs}$ | 2.22 |

As seen by line 400A in FIG. 4A, antenna 10 has a 3dB beamwidth in the azimuthal plane of approximately 160°. Line 400B in FIG. 4B shows antenna 10 has a 3dB beamwidth in the elevation plane of approximately 60°. The beam center in the elevation plane occurs at an elevation angle of approximately 20°.

The performance of antenna 10 can be changed by varying the parameters of antenna construction. If the parameter L is shortened, the 3dB beamwidth in the elevation plane increases. In addition, the beam becomes centered closer to the value of $\theta_{EL}$ equal to 90°. In other words, the antenna has a near broadside radiation pattern. Conversely, an increase in L tends to concentrate the beam in the elevation plane closer to values of $\theta_{EL}$ near zero. In other words, the antenna has an end-fire radiation pattern.

Figure 5:
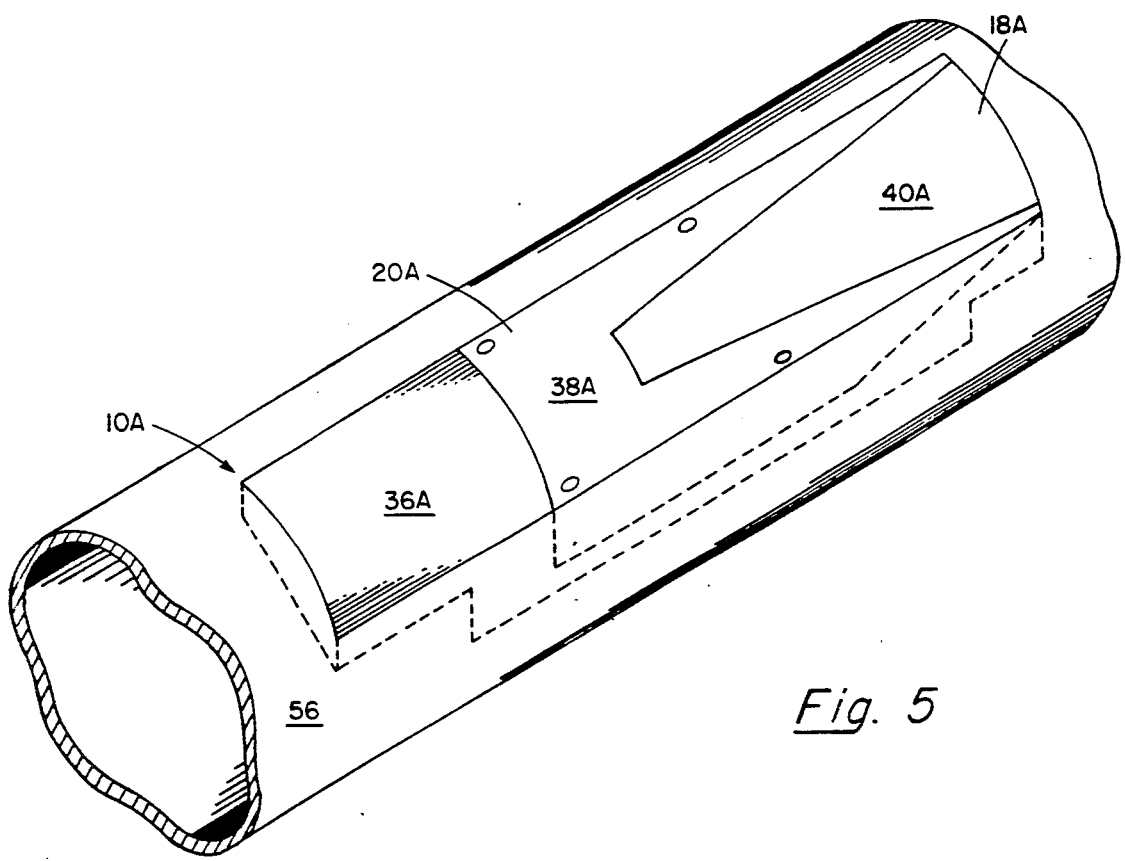
FIG. 5 shows another embodiment of the invention mounted in an object with a curved surface.

Additionally, the width W of dielectric slab 18 can be varied. Increasing the value of W tends to decrease the 3dB beamwidth in the azimuthal plane. FIG. 5 shows an alternative embodiment of the antenna. Antenna 10A contains a dielectric slab 18A which tapers outwards away from microstrip horn 16 (not shown). The added width of the taper tends to decrease the 3dB beamwidth in the azimuthal direction.

EXAMPLE II

Near hemispherical elevation coverage over $\theta_{EL} = 0°$ to $\theta_{EL} = 170°$ can be achieved by varying some of the parameters shown in Table I. With $L = 0.53 \lambda_o$ and $\epsilon_r = 6$, there will be less than 8dB of gain variation and a front to back ratio of less than 3.5dB (at $\theta_{EL} = 20°$ and $\theta_{EL} = 160°$). An antenna constructed with the dimensions of this example can achieve an impedance matched peak gain of not less than 2dBi and a half power beamwidth of not less than 62° measured in the plane $\theta_{EL} = 0°$ over a 3:1 frequency band.

FIG. 5 also shows how an antenna can be flush mounted to a surface. Antenna 10A is recessed into surface 56. Here, surface 56 is curved. Upper surfaces 36A, 38A, and 40A are shaped to conform to surface 56.

Having described embodiments of the invention, it will be apparent to one of skill in the art that various modifications to the disclosed embodiments could be made. For example, the antenna has been described only in relation to the transmission of signals, but could be used to receive signals. Additionally, the antenna has been shown to mount flush with planar or curved surfaces, but could be readily extended to conform to any shape surface. The flush mount antenna could be arrayed, resulting in a flush mount array antenna. Therefore, the invention should be defined by the spirit and scope of the appended claims.

What is claimed is:

1. An antenna comprising:
   a) a substantially planar microstrip circuit for coupling radio frequency energy between a pair of ends of such circuit, such circuit having a strip conductor separated from a ground plane conductor by a dielectric;
   b) a conductive structure comprising opposing walls, such walls providing side portions of a cavity formed in such structure, such cavity having a pair of openings, a proximal one of the pair of openings being electrically coupled to a first one of the pair of ends of the microstrip circuit, such walls having surface portions inclined with respect to the substantially planar microstrip circuit, such walls having outer ends terminating at a distal one of the pair of openings of the cavity, such outer ends of the opposing walls being disposed on a common surface, said common surface and said strip conductor being disposed above the ground plane conductor; and c) a radio frequency energy feed coupled to a second one of the pair of ends of the microstrip circuit, and wherein radio frequency energy passing between free space and the feed, serially passes through the pair of openings of the cavity and the microstrip circuit.

2. The antenna recited in claim 1 including additionally a dielectric material disposed in said cavity, said dielectric material having a surface terminating at the outer ends of the walls.

3. The antenna recited in claim 2 wherein the substantially planar microstrip circuit comprises a microstrip horn having a narrow portion coupled to the feed and a wide portion disposed adjacent the proximal opening of the cavity.

4. The antenna recited in claim 2, such antenna being adapted for flush mounting with a conformal surface, and wherein the surface of the dielectric material disposed in the cavity is flush with the conformal surface.

* * * * *